United States Patent [19]

Norling

[11] Patent Number: 5,463,233

[45] Date of Patent: Oct. 31, 1995

[54] MICROMACHINED THERMAL SWITCH

[75] Inventor: Brian L. Norling, Mill Creek, Wash.

[73] Assignee: AlliedSignal Inc., Morris Township, N.J.

[21] Appl. No.: 81,592

[22] Filed: Jun. 23, 1993

[51] Int. Cl.⁶ .......................... H01H 37/54; H01H 37/12; H01L 29/43; H01L 29/772
[52] U.S. Cl. .......................... 257/254; 257/410; 257/467; 257/750; 337/16; 337/36; 337/89; 337/298
[58] Field of Search .................................. 337/16, 36, 89, 337/298, 299, 300; 257/734, 750, 467, 410, 368, 379, 252, 254, 469

[56] References Cited

U.S. PATENT DOCUMENTS

| | | | |
|---|---|---|---|
| 2,891,124 | 6/1959 | Vaughan | 337/89 |
| 2,967,269 | 1/1961 | Vaughan | 337/89 |
| 3,146,378 | 8/1964 | Grenier | 337/36 |
| 3,553,540 | 1/1971 | Puterbaugh et al. | 257/254 |
| 3,896,309 | 7/1975 | Halsor et al. | 257/254 |
| 4,038,627 | 7/1977 | Johnson | 257/467 |
| 4,695,715 | 9/1987 | Malm | 257/249 |
| 5,058,856 | 10/1991 | Gordon et al. | 257/467 |
| 5,235,308 | 8/1993 | Shimada et al. | 337/89 |

FOREIGN PATENT DOCUMENTS

| | | | |
|---|---|---|---|
| 3112555 | 10/1982 | Germany | 337/36 |
| 0020362 | 1/1986 | Japan | 257/467 |

Primary Examiner—William Mintel
Assistant Examiner—Peter Toby Brown
Attorney, Agent, or Firm—Howard G. Massung

[57] ABSTRACT

A monolithic micromachined temperature switch obviates the necessity of assembling discrete components and also allows the temperature switch to be disposed in a relatively small package. In one embodiment of the invention, the temperature switch includes a bimetallic element operatively coupled to a pair of electrical contacts. In order to minimize contact wear due to contact arcing, a biasing force such as an electrostatic force is applied to the switch which provides snap action of the electrical contacts in both the opening and closing directions which enables the temperature set point to be adjusted by varying electrostatic force biasing voltage. In an alternate embodiment of the invention, the biasing force for providing the snap action effect can be eliminated by substituting the movable contacts with a field effect transistor with a movably mounted gate terminal. With such an arrangement since little or no current would normally flow through the gate terminal, the need to reduce contact arcing normally resulting from contact bounce would thus be eliminated. Thus, in such an embodiment, a biasing force such as an electrostatic biasing force is not necessary unless a snap action with hysteresis is desired. In alternate embodiments of the invention, the temperature switch may be formed with an integral power transistor for switching relatively large currents. The temperature switch may also be provided with an integrally formed capacitor for reducing the effects of switching inductive loads, such as relays and the like.

30 Claims, 8 Drawing Sheets

FIG.4
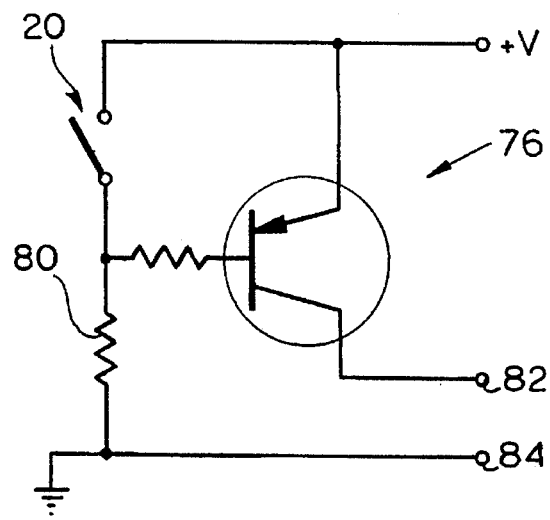
FIG.5
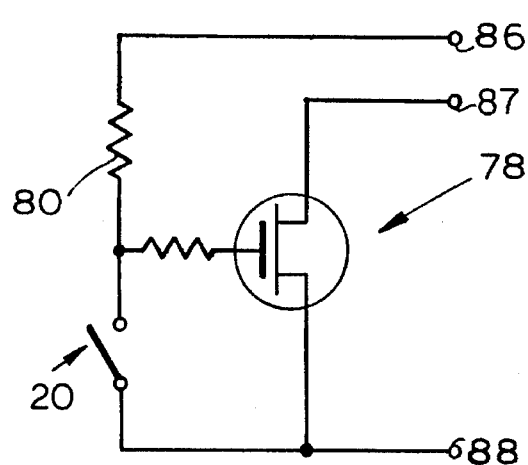
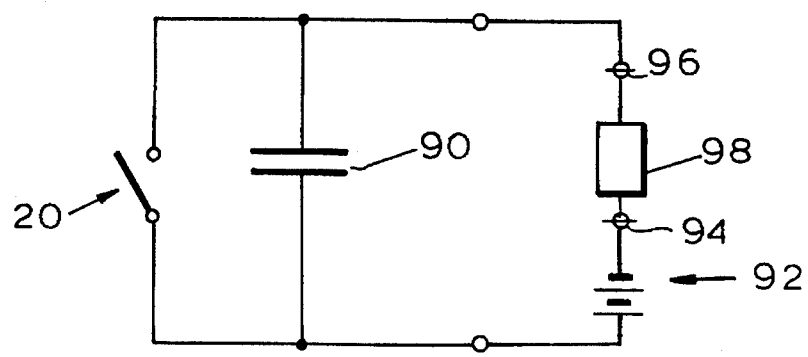
FIG.6
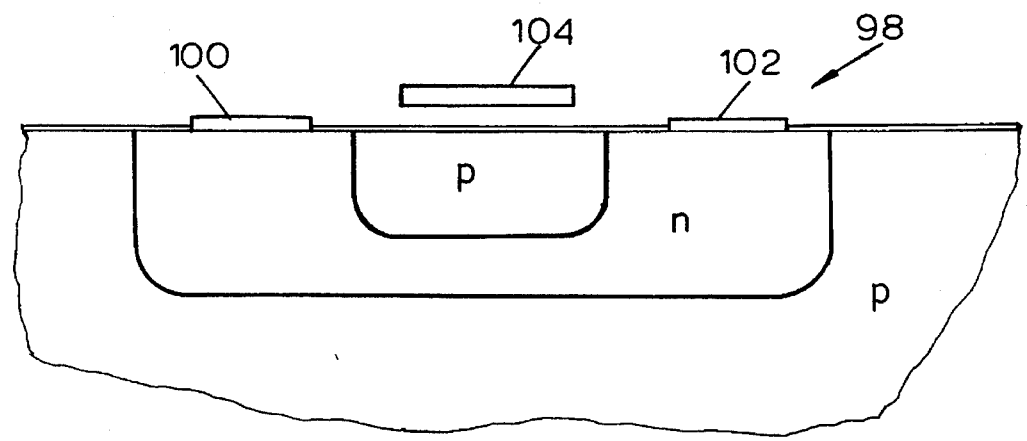
FIG.7

MICROMACHINED THERMAL SWITCH

BACKGROUND OF THE INVENTION

1. Field of the Invention

The present invention relates to a temperature switch and more particularly to a monolithic temperature switch formed by micromachining for use in applications where space is relatively limited, such as in disposable probes for aircraft windscreens, that is relatively tolerant of dynamic environments such as, vibration and acceleration forces, which includes a sensing element and a pair of electrical contacts that are controlled as a hysteretic function of temperature with a snap-acting response to minimize wear on the contacts due to contact bounce.

2. Description of the Prior Art

Various temperature sensors are known in the art. Such sensors are used in various measurement and control applications. For example, thermocouples, RTD's and thermistors are used for measuring temperature in various applications. Such sensors provide an electrical analog signal, such as a voltage or a resistance, which changes as a function of temperature. Monolithic temperature sensors are also known. For example, a diode connected bipolar transistor can be used for temperature sensing. More specifically, a standard bipolar transistor can be configured with the base and emitter terminals shorted together. With such a configuration, the base collector junction forms a diode. When electrical power is applied, the voltage drop across the base collector junction varies relatively linearly as a function of temperature. Thus, such diode connected bipolar transistors have been known to be incorporated into various integrated circuits for temperature sensing.

Although the above described devices are useful in providing relatively accurate temperature measurements, they are generally not used in control applications to control electrical equipment. In such control applications various types of temperature switches are used. Such temperature switches typically consist of a sensing element which provides a displacement as a function of temperature and a pair of electrical contacts. The sensing element is typically mechanically interlocked with the pair of electrical contacts to either make or break the electrical contacts at predetermined temperature set points. The temperature set points are defined by the particular sensing element utilized.

Various types of sensing elements are known which provide a displacement as a function of temperature. For example, bimetallic elements, mercury and reed switches are known to be used in such temperature switches.

Bimetallic elements typically consist of two strips of materials having different rates of thermal expansion fused into one element. Upon a temperature changes, unequal expansion of the two materials generally causes the element to bend in an arc. By mechanically interlocking the bimetallic element with a pair of electrical contacts, such displacement can be used to either make or break the electrical contacts.

Mercury temperature sensors consist of a mercury filled bulb and an attached glass capillary tube which acts as an expansion chamber. Two electrical conductors are disposed within the capillary at a predetermined distance apart. The electrical conductors act as an open contact. As the temperature increases, the mercury expands in the capillary tube until the electrical conductors are shorted by the mercury forming a continuous electrical path. The temperature at which the mercury shorts the electrical conductors is a function of the separation distance of the conductors.

Reed switches have also been known to be used as temperature sensors in various temperature switches. Such reed switch sensors generally consist of a pair of toroidal magnets separated by a ferrite collar and a pair of reed contacts. At a critical temperature known as the Curie point, the ferrite collar changes from a state of low reluctance to high reluctance to allow the reed contacts to open.

Such known temperature switches as discussed above are normally assembled from discrete components. As such these temperature switches are relatively large and are not suitable for use in various applications where space is rather limited. Moreover, the assembly cost of such temperature switches increases the overall manufacturing cost.

There are also various other problems associated with such known temperature switches. More specifically, many of such switches are generally not known to be tolerant of external forces, such as vibration and acceleration forces. Consequently, such temperature switches are generally not suitable for use in various applications, for example, in an aircraft. Another problem with such known temperature switches relates to the calibration. More specifically, such known temperature switches generally cannot be calibrated by the end user. Thus, such known temperature switches must be removed and replaced if the calibration drifts, which greatly increases the cost to the end user.

SUMMARY OF THE INVENTION

It is an object of the present invention to solve the problems associated with the prior art.

It is another object of the present invention to provide a temperature switch that is tolerant of external forces, such as vibration and acceleration forces.

It is yet another object of the present invention to provide a temperature switch that is suitable for use in applications where space is rather limited.

It is yet a further object of the present invention to provide a temperature switch which obviates the need for assembly of discrete components.

It is yet a further object of the present invention to provide a temperature switch which may be relatively easily calibrated by the end user.

Briefly, the present invention relates to a monolithic temperature switch, adapted to be micromachined which obviates the necessity of assembling discrete components and also allows the temperature switch to be utilized in applications where space is rather limited. In one embodiment of the invention, the temperature switch includes a bimetallic element operatively coupled to a pair of electrical contacts. In order to minimize contact wear due to contact arcing, a biasing force is applied to the bimetallic element which causes the electrical contacts to snap open and closed. Due to the relatively small size of the temperature switch and consequently the relatively small gap between the electrical contacts, electrostatic force may be used for biasing. Since the electrostatic force can be varied by adjusting the biasing voltage, the hysteresis and the temperature set points can be rather easily adjusted. Moreover, the relatively small size of the device results in a relatively high resonant frequency, which allows the temperature switch to tolerate external forces, such as vibration and acceleration forces. In an alternate embodiment of the invention, the biasing force for providing the snap action effect can be eliminated by substituting the electrical contacts with a field effect transistor (FET) formed with a movably mounted gate terminal. Since little or no electrical current flows through the gate terminal in such an arrangement, the need to reduce contact arcing can thus be eliminated. Consequently, in such an embodiment, a biasing force, such as an electrostatic force, is not necessary if a snap action with hysteresis is not desired. In alternate embodiments of the invention, the monolithic temperature switch may be formed with an integral power transistor for switching relatively large currents or an integrally formed capacitor for reducing the effects of switching inductive loads, such as relays and the like.

BRIEF DESCRIPTION OF THE DRAWING

These and other objects and advantages of the present invention will become readily apparent upon consideration of the following detailed description and attached drawing, wherein:

FIG. 4 is a schematic representation of an alternate embodiment of the temperature switch illustrated in FIG. 1, which incorporates an integrally formed bipolar power transistor;

FIG. 5, similar to FIG. 4, illustrates an integrally formed field effect power transistor;

FIG. 6, similar to FIG. 4, illustrates an integrally formed capacitor;

FIG. 7 is a partial elevational view of another alternate embodiment of the temperature switch in accordance with the present invention formed from junction field effect transistor with a movably mounted gate terminal;

DETAILED DESCRIPTION OF THE PREFERRED EMBODIMENT

Figure 1:
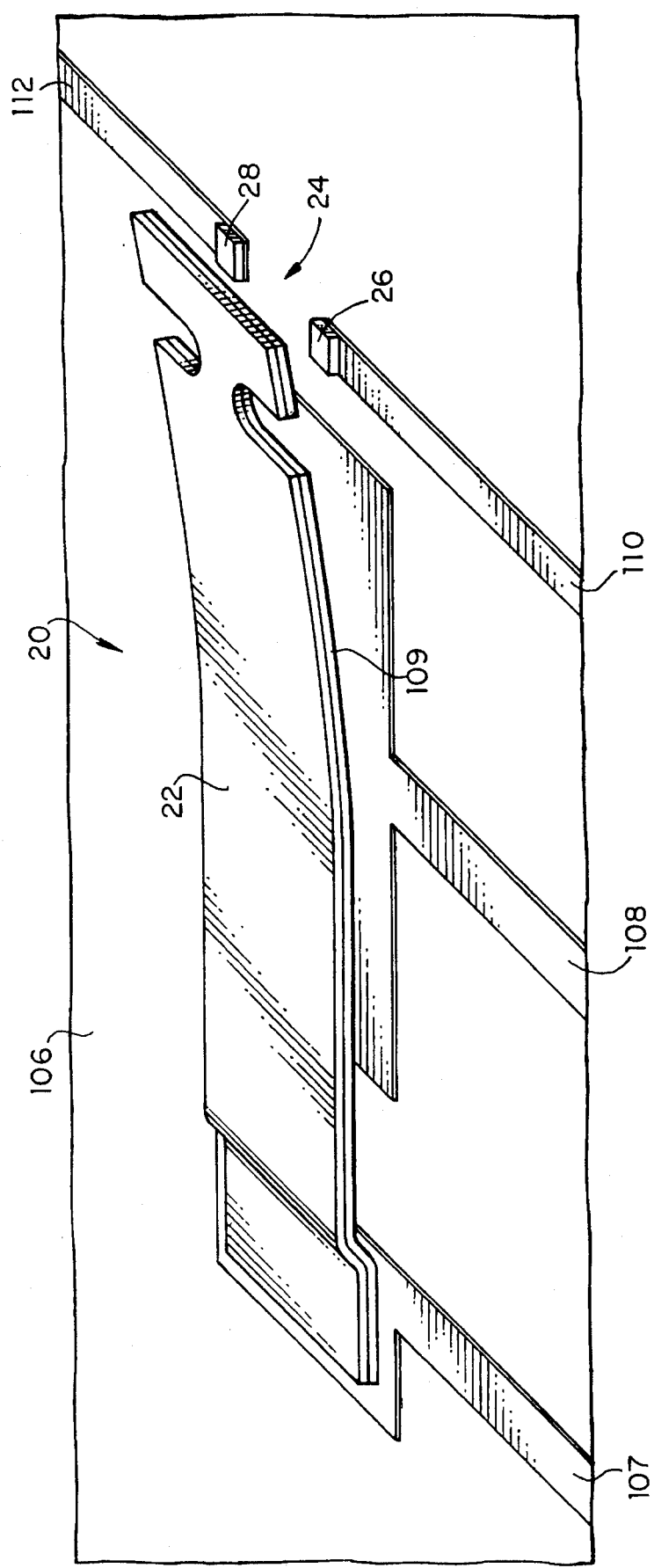
FIG. 1 is a perspective view of the temperature switch in accordance with the present invention shown in the open position.

Referring to FIG. 1, the present invention relates to a thermal or temperature switch, generally identified with the reference numeral 20, which includes a temperature sensing element 22 and a pair of electrical contacts 24, which include a pair of fixed electrical contacts 26 and 28 and a movably mounted contact (not shown). The temperature sensing element 22 may be formed from a bimetallic element as illustrated in FIG. 1. As is known by those of ordinary skill in the art, such bimetallic elements are formed from two strips of materials having different rates of thermal expansion, bonded together into one element. Due to the unequal coefficient of expansion of the two materials, the bimetallic element normally bends in an arc as a function of temperature. By rigidly disposing the movable electrical contact relative to the bimetallic element 22, the pair of electrical contacts 24 will thus be made to open or close as a function of temperature.

Due to the relatively slow speed of travel of such bimetallic elements 22 during a temperature change, the electrical contacts 24 may become damaged due to contact arcing. More specifically, in such an arrangement, since the electrical contacts 24 normally open and close relatively slowly, arcing may occur during intermediate states where the electrical contacts 24 are either close together or are only lightly touching. Such arcing wears out the mating surfaces of the electrical contacts as well as raises the contact resistance. As a result, the cycle life of such temperature switches using bimetallic sensing elements is significantly reduced.

The temperature switch 20 in accordance with the present invention, solves this problem of contact arcing. More specifically, in one embodiment of the present invention, the temperature sensing element 22 is biased with a force, such as a non-linear force, to create a snap action bistable switch. In addition to providing rapid opening and closing of the electrical contacts 24, the non-linear force additionally mitigates contact bounce from external forces, such as vibration and acceleration forces. Accordingly, the temperature switch 20 is suitable for use in aircraft, surface vehicles and other high vibration environments.

Due to the relatively small size of the temperature switch 20, electrostatic force may be used as the non-linear force for biasing the temperature sensing element 22. More specifically, the temperature sensing element 22 in combination with the pair of electrical contacts 24 may be modeled as a parallel plate capacitor. Assuming that a constant voltage is applied between the plates and further assuming that the plates remain relatively parallel during the operating range of the temperature switch and ignoring errors due to finite plate width, the attraction force between the plates is provided by Equation 1 as follows:

(1) $F = \epsilon_o A V^2 / 2d^2$, where

A = the plate area;

V = the voltage applied between the plates;

d = the distance or gap between the plates; and $\epsilon_o$ = the permetivity of free space.

Thus, the attraction force between the plates is directly proportional to the square of the voltage applied to the plates and inversely proportional to the square of the distance between the plates. For relatively large gaps between the plates, the electrostatic attraction force between the plates is relatively small. Consequently, for such relatively large gaps, electrostatic force is not viable as a biasing force. However, for relatively small gaps, for example, in the range of 4–5 microns, the electrostatic attraction force between the plates is sufficient to allow electrostatic force to be used as a biasing source for the temperature switch 20 for several reasons. First, due to a breakdown phenomena in such small gaps, the electrical breakdown voltage in such gaps is relatively larger than the electrical breakdown voltage in relatively larger gaps. For example, the electrical breakdown voltage in a relatively small gap is 300,000 volts per meter compared to an electrical breakdown of 3,000 volts per meter in relatively larger gaps. This relatively larger breakdown voltage in small gaps allows a relatively larger voltage to be applied to the parallel plates without breakdown which results in relatively larger electrostatic attraction forces between the plates. More specifically, since the electrical field strength at which breakdown occurs is relatively larger for such small gaps, a relatively higher electrical field can be applied between the two parallel plates to provide a relatively large attraction force. Secondly, because of the relatively small size of the gap, a relatively small voltage can be used to generate a relatively large electrical field between the plates. For example, a 12 volt source can be used to provide an electrical field strength of 4 million volts per meter in a 3 micron gap.

Thus, for relatively small gaps, for example, 5 microns or below, electrostatic forces can be used to bias the temperature switch 20 to provide a non-linear attraction force in order to switch the electrical contacts 24 as a hysteretic function of temperature as will be discussed below. Since the electrostatic biasing force is adjustable by adjusting the magnitude of the voltage applied to the plates, the hysteresis of the temperature switch 20 as well as the set point can rather easily be adjusted.

Figure 2:
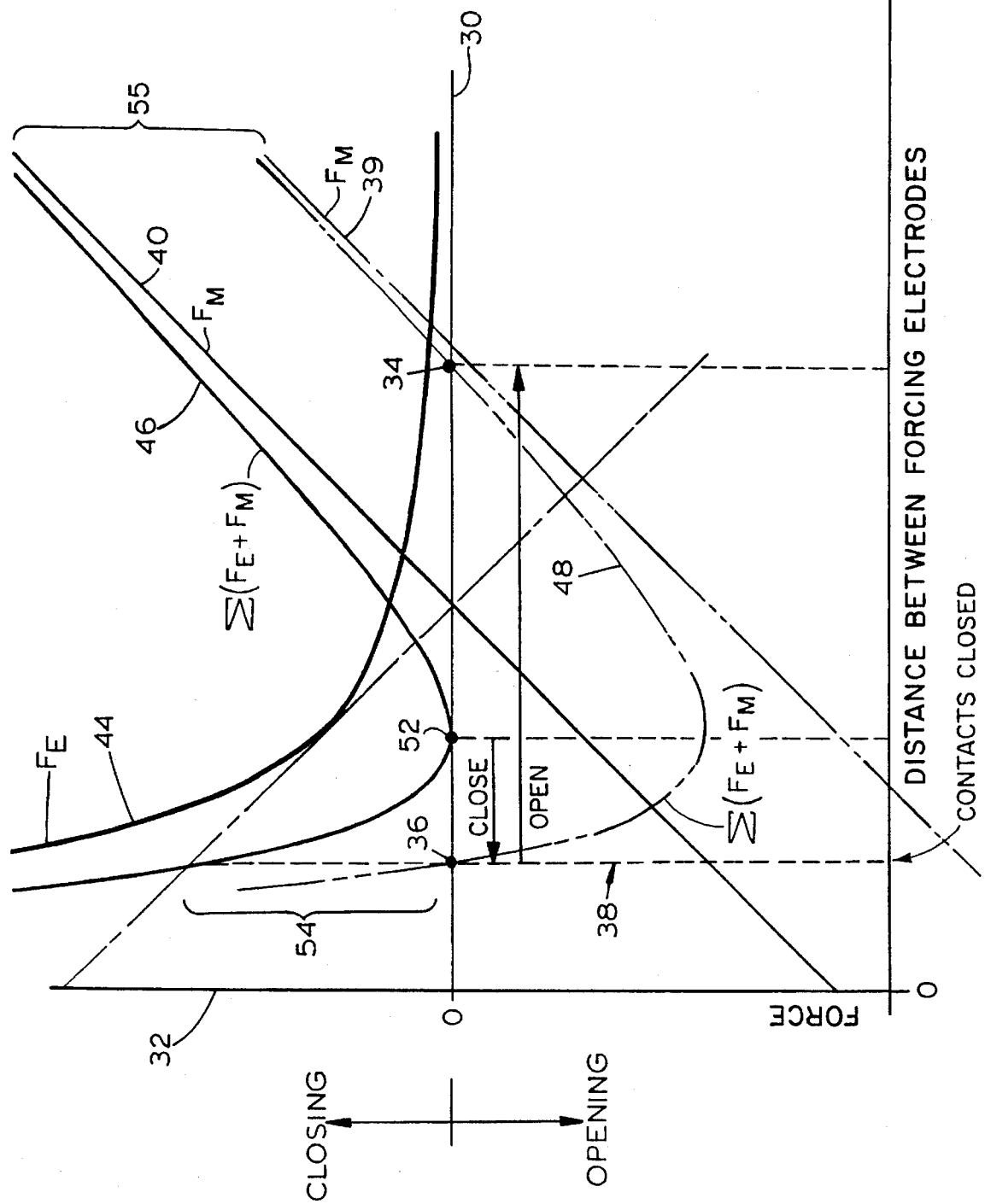
FIG. 2 is a graphical representation of the forces acting in the sensing element of the temperature switch of FIG. 1 as a function of the gap between the electrical contacts for various operating states.

The operation of the temperature switch 20 utilizing an electrostatic force as a biasing force is illustrated in FIG. 2. More specifically, FIG. 2 illustrates the electrical and mechanical forces acting upon the temperature sensing element 22 as a function of temperature and separation distance between the electrical contacts 24. The horizontal axis 30 shows the separation distance between the forcing electrodes 108 and 109, while the vertical axis 32 relates to the force applied to the temperature sensing element 22. The point on the horizontal axis 30 identified with the reference numeral 34 denotes the position where the electrical contacts 24 are fully open. The point on the horizontal axis 30 identified with the reference numeral 36 illustrates the point where the electrical contacts 24 are closed. Since the attraction force between the temperature sensing element 22 and the bias electrode 108 is inversely proportional to the square of the separation distance, as indicated above in Equation 1, a mechanical limit stop (indicated by the reference numeral 38) is provided by the electrical contacts 24 in a closed position. Otherwise it would be virtually impossible to open the switch since the attraction force approaches infinity as the distance between the bias electrodes 108 and 109 approaches zero.

The forces acting upon the temperature sensing element 22 are a combination of the mechanical force $F_M$ (e.g., mechanism beam stiffness of the bimetallic element) and the electrostatic attraction force $F_E$. As is generally known by those of ordinary skill in the art, the mechanical beam stiffness force ($F_M$) is a linear function of the displacement of the bimetallic element 22 from a null position. Thus, as the temperature changes, the null point shifts along the horizontal axis 30. The mechanical beam stiffness force $F_M$ is provided by equation 2 below:

(2) $F_M = A + BX$, where

X = the separation distance of the electrical contacts;

A is temperature dependent;

B is the linear spring force; and the null point is $(-A/B)$.

To teach the merits of this invention, we will first describe the beam element without the electrostatic forces. From Equation 2, the mechanical beam stiffness force F is a straight line function and is illustrated graphically in FIG. 2 by the lines 39 and 40 for the two stable operating states of the temperature switch 20. The distance 55 is the change in mechanical element force curves 40 and 39 between the opening and closing temperatures due to differential coefficient of thermal expansion forces in the beam changing null position, but not affecting spring rate (the slope of lines 39 and 40). More specifically, line 39 represents the mechanical beam stiffness $F_M$ force component at the opening temperature. The null point at opening is indicated by the point at which the line 48 crosses the horizontal axis 30 as indicated by the reference numeral 34. As the temperature changes, the null point shifts along the horizontal axis 30 until the electrical contacts 24 reach the stop limit 38 discussed above. At this point, the null point for the bimetallic strip is at the point indicated by the reference numeral 52 on the horizontal axis 30.

Between the null points 34 and 52, the mechanical force $F_M$ causes nearly linear motion of the bimetallic element 22 as a function of temperature. However, in order to reduce the effects of contact arcing, the non-linear electrostatic force $F_E$ is used for biasing. The non-linear biasing force provides for snap action of the electrical contacts 24 in both an opening and closing direction. By providing such a non-linear force, the temperature switch 20 in accordance with the present invention will be relatively tolerant of external forces, such as vibration and acceleration forces which can cause contact wear thereby reducing the cycle life as discussed above. Additionally, contact wear due to contact bounce during opening and closing of the electrical contacts 24 is virtually eliminated by the squeezer film damping of the biasing electrode 108 and the high closing force.

As discussed above, due to the relatively small size of the temperature switch 20, an electrostatic attraction force $F_E$ is used to provide biasing of the temperature sensing element 22. From Equation 1, the electrostatic attraction force $F_E$ is inversely proportional to the separation distance between the contacts 24. Thus, for a constant voltage, the electrostatic force $F_E$ is provided by Equation 3:

(3) $F_E = C/X2$ where,

C is a constant;

X is the separation distance between the electrical contacts.

The electrostatic force $F_E$ is illustrated graphically in FIG. 2 by the curve identified with the reference numeral 44. The electrostatic force $F_E$ always acts as an attraction force. As is apparent from the curve 44, the electrostatic force $F_E$ is relatively larger when the electrical contacts 24 are relatively closer together. Conversely, as the electrical contacts 24 get further apart, the electrostatic force FB becomes relatively small. This non-linearity is a critical component of the function of the switch.

As will be apparent from the discussion below, the non-linear electrostatic attraction force causes the temperature switch 20 to be bistable defining open and closed stable states. The electrostatic attraction force $F_E$ acts in concert with the mechanical beam stiffness force $F_M$ on the temperature sensing element 22 to cause the electrical contacts 24 to snap open and snap closed. In the opening direction, the mechanical beam stiffness force $F_M$ predominates and causes the electrical contacts 24 to snap open. In the closing direction, the electrostatic attraction force $F_E$ predominates causing the electrical contacts 24 to snap closed. More specifically, the curves 46 and 48 represent the sum of the mechanical beam stiffness force $F_M$ and the electrostatic attraction force $F_E$ for the two stable operating states of the temperature switch 20. As discussed above, the mechanical beam stiffness force (indicated by the lines 39 and 40) shifts between the null points 34 and 52 as a function of temperature. This causes upward or downward movement of the curves 46 and 48.

In operation, when the electrical contacts 24 are fully open, an increasing temperature causes the null point 34 to shift to left (FIG. 2). At some point, the mechanical force $F_M$ and the electrostatic force $F_E$ are equal and opposite, for example, the point 52. Beyond the point 52, the system becomes unstable because the electrostatic force $F_E$ increases much more rapidly than the mechanical force $F_M$ and causes the electrical contacts 24 to snap closed. More specifically, if the mechanical force $F_M$ is summed with the electrical force E, the resulting cure is parabolic in shape as indicated by the curve 48 when the electrical contacts 24 are fully open. As the null point 34 shifts to the left, the curve 48 moves upwardly until it reaches the position indicated by the curve 46. In this position, since all of the force is positive or in a closing direction, the electrical contacts 24 will snap closed to the point of the limit stop 38. The position at which the system becomes unstable and snaps closed can be defined in Equation 4 below which is the sum of the forces $F_M$ and $F_E$:

(4) *Minimum [C/X2+A+BX]=)*

This minimum (e.g., derivative with respect to X) is illustrated graphically by the reference numeral 52 in FIG. 2 and represents the point where the total force is in a closing direction. The force at closing is indicated by the bracket 54 in FIG. 2. Such closing force is sufficiently rapid to minimize, if not eliminate, contact arcing. Moreover, after the electrical contacts 24 are closed, there will be a net closing force to maintain the electrical contacts 24 in a closed position. As such, contact wear resulting from external forces, such as vibration and acceleration forces, is minimized.

In the opening direction, the null point of the temperature sensing element 22 creeps to the right (FIG. 2). As the null point shifts to the right, the net force (indicated by the curve 46) moves downwardly. As the null point approaches the point identified with the reference numeral 34 as the electrical contacts 24 begin to open, the electrostatic force $F_E$ becomes less dominant and is opposed by the mechanical force $F_M$. AS the null point approaches the point identified with the reference numeral 34, the mechanical force $F_M$ is able to overcome the electrostatic force $F_E$ to cause the electrical contacts 24 to snap open. More specifically, with reference to FIG. 2, the net force during an opening stroke is illustrated by the curve 48. The electrical contacts open when the mechanical force $F_M$ is equal to the electrostatic force for X equal the limit stop. This is illustrated in Equation 5 below:

(5) $A+BX=-C/X^2$ for X=limit stop

Figure 3:
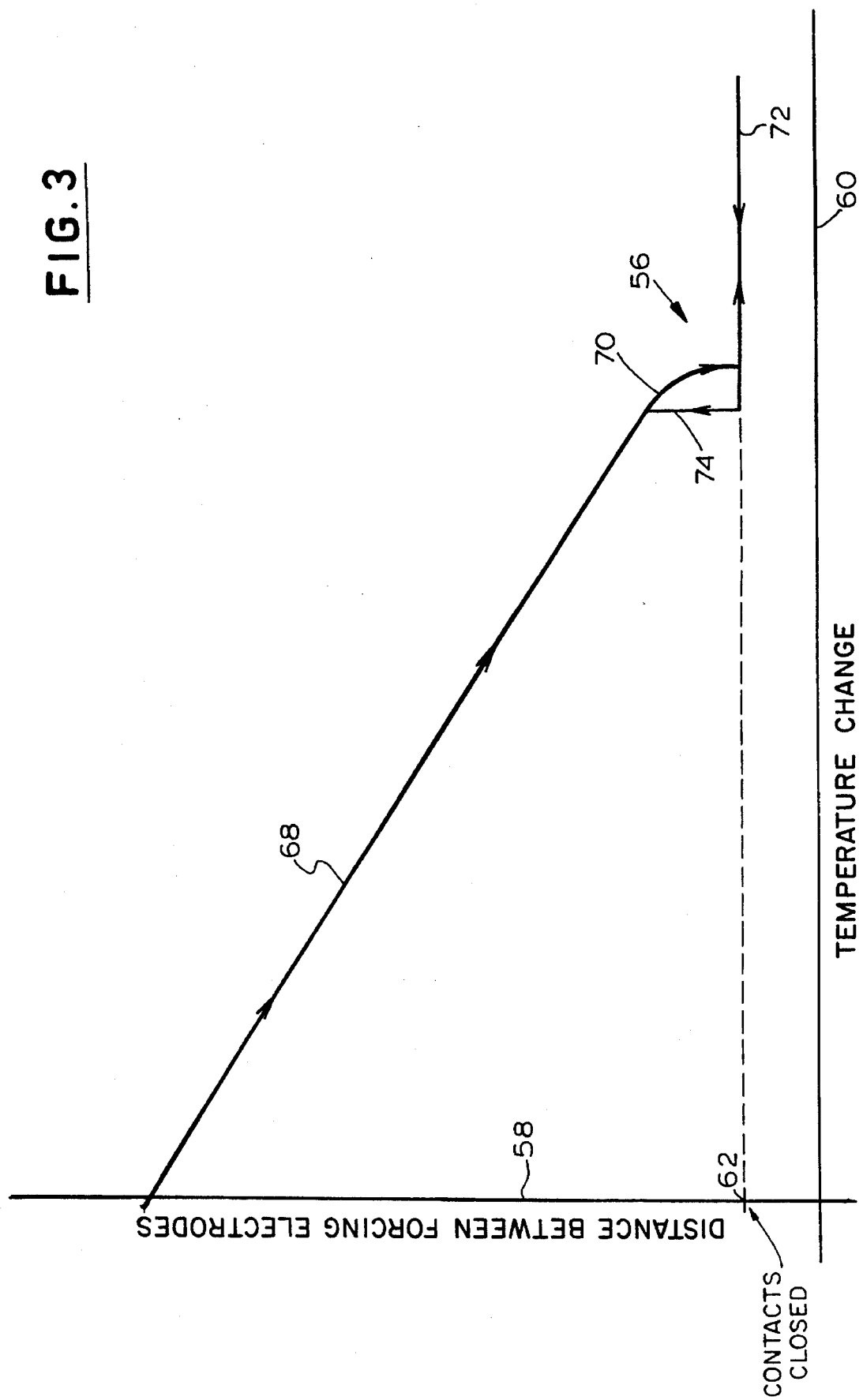
FIG. 3 is a graphical representation of the electrical contact spacing as a function of temperature of the temperature switch in accordance with the present invention.

The electrostatic force $F_E$ and the stop limit 38 causes the temperature switch 20 to operate as a hysteretic function of temperature. With reference to FIG. 3, the hysteresis is indicated by the reference numeral 56. More specifically, FIG. 3 illustrates contact spacing of the electrical contacts 24 as a function of temperature. The vertical axis 58 relates to spacing of the forcing electrodes 108 and 109 while the horizontal axis 60 relates to temperature. The point on the horizontal axis 58 identified with the reference numeral 62 denotes the limit stop of the contacts in the closed position.

The reference numeral 64 denotes the position where the electrical contacts 24 are fully closed.

In operation, from the open position anywhere on line 68, temperature switch 20 follows the path indicated by the reference numerals 68, 70 and 72. In a closing direction, the temperature switch 20 follows the path indicated by the reference numerals 72, 74 and 68. As illustrated in FIG. 3, the limit stop as well as the electrostatic force $F_E$ controls the hysteresis. Thus, by fixing the limit stop, the hysteresis 56 and temperature set point of the switch can be adjusted by adjusting the electrostatic force which is adjusted simply by varying the biasing voltage applied. The hysteresis also prevents cycling of the temperature switch at the set point. Alternatively, the switch can be made to close on rising temperatures by selection of materials with appropriate thermal coefficients of expansion for the temperature sensing element 22.

As discussed above, the temperature switch 20 is relatively tolerant of external forces, such as vibration and acceleration forces. More specifically, as indicated below due to the relatively small size of the temperature switch 20, the resonant frequency is in the range of 100,000 Hz. As is known by those of ordinary skill in the art, the response of the temperature switch to an external force, such as a vibration or acceleration force, depends on the relationship between the frequency of the external force and the natural frequency of the temperature switch 20. Since the frequency of any external force will likely be much smaller than the natural frequency of the temperature switch 20, any amplitude resulting from the external force will not build up. Accordingly, the temperature switch 20 can tolerate such external forces. Moreover, as further indicated below, the tip deflection of the temperature sensing element 22 will only be about 0.0003 microns.

CALCULATION OF RESONANT FREQUENCY AND TIP DEFLECTION

Figure 19:
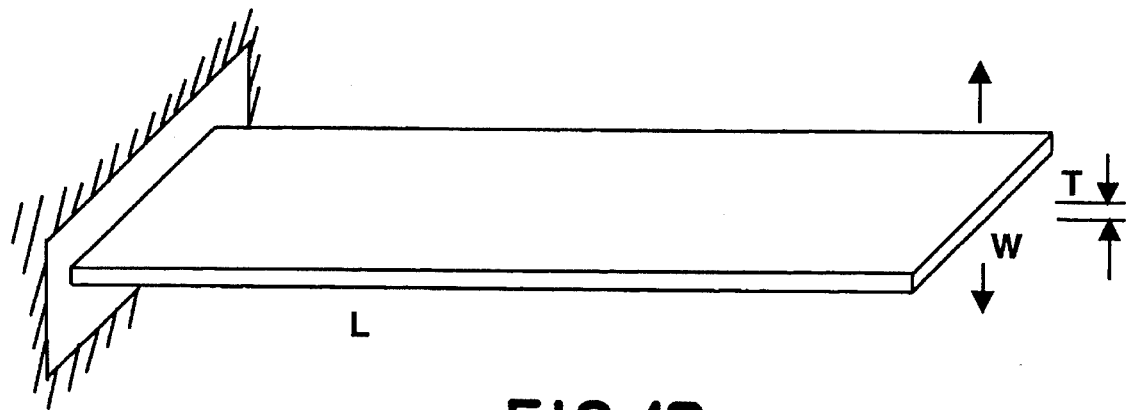
FIG. 19 is a perspective view of a model of an exemplary temperature switch in accordance with the present invention.

Referring to FIG. 19, FIG. 19 illustrates a perspective view of a model of an exemplary temperature switch in accordance with the present invention. Referring to FIG. 19, the temperature switch is modeled as an aluminum cantilever beam having a length L, a width W and a thickness T. The assumed values for the calculation are provided below in Table 1.

TABLE 1

Length (L) = 200 microns = 0.007872 inches;

Width (W) = 20 microns = 0.00787 inches;

Thickness (T) = 5 microns = 0.000197 inches;

Density (p) = 0.1 lb/in$^3$; and

Modulus of elasticity = 10×106 lb/in$^2$.

The resonant frequency of the model is provided by Equation 6 below:

$$f_n = \frac{3.52}{2\pi} \sqrt{\frac{EI_g}{wL_4}}, \text{ where} \tag{6}$$

E represents the modulus of elasticity;

I represents the moment of inertia;

g represents gravity;

w represents the uniform load per unit length; and

L represents the length of the beam.

The uniform load per unit length of the beam (w) is provided by Equation 7 below:

(7) $w = WT\rho$, where

W represents the width of the beam;
T represents the thickness of the beam; and
O represents the density of the beam.

The moment of inertia (I) of the beam is provided in Equation 8 below:

(8) $I = WT^3/12$, where

W represents the width of the beam; and
T represents the thickness of the beam.

Substituting for w and I into Equation 6 yields Equation 9 as follows:

$$f_n = \frac{3.52}{2\pi} \sqrt{\frac{EWT^3 g}{12 WT\rho L^4}} \quad (9)$$

By substituting values from Table 1, the resonant frequency $f_n$ for the beam will be about 100,000 hertz.

The tip deflection (Ymax) is determined from Equation 10 as follows:

$$Ymax = \frac{-wL4}{EI} \quad (10)$$

Substituting for w and I yields Equation 11:

$$Ymax = \frac{-12\rho L4}{ET^2} \quad (11)$$

Plugging in values from Table 1 into Equation 11 yields a tip deflection of about 0.0003 microns.

In order to further reduce the sensitivity of the temperature switch 20 to external forces, such as vibration and acceleration forces, the temperature switch is formed with integral damping. For example, the temperature switch 20 may be integrally formed with squeeze film damping.

Because of the relatively small size of the temperature switch 20, the current carrying capabilities are limited. Accordingly, a power transistor can be used for switching relatively large electrical currents. As will be discussed in more detail below, the temperature switch 20 is adapted to be formed by micromachining as a monolithic chip. As such, the power transistor discussed above and the capacitor discussed below can rather easily and inexpensively be incorporated on the same chip as the temperature switch 20 forming an integrated circuit. More specifically, with reference to FIGS. 4 and 5, either a bipolar transistor 76 or a field effect transistor 78 can be incorporated into the same chip. With reference to FIG. 4, low side switching is accomplished by connecting the temperature switch 20, shown schematically, between the base of the bipolar transistor 76 and a positive voltage source, +V. An integrally formed current limiting resistor 80 may be connected between the base and the ground 84. In such an application the source voltage +V for the power transistor 76 also provides the non-linear electrostatic attraction force as discussed above. In this application, the electrical current is switched by the power transistor 76 and not the temperature switch 20. In operation, when the temperature switch 20 closes, electrical current flows through the current limiting resistor 80 to turn on the power transistor 76. Thus, the switched output may be sensed between the terminals 82 and 84.

In an alternative embodiment, configured for high side switching a field effect transistor (FET) 78 is incorporated into the same chip along with the temperature switch 20. In this embodiment, the temperature switch 20 is connected between the gate and the drain terminal of the FET while the current limiting resistor 80 is connected between the gate and an output terminal 86. In this embodiment, as the temperature switch 20 closes, the voltage drop across the current limiting resistor 80 causes the power transistor 78 to turn on. In this embodiment, the switched output would be between the terminals 86 and 87. By incorporating power transistors, such as the power transistors 76 and 78 into the chip along with the temperature switch 20, the current carrying capabilities of the system are greatly enhanced.

In another alternative embodiment of the present invention, a capacitor 90 may be incorporated on the same chip to protect the temperature switch 20 from contact arcing resulting from switching of inductive loads. More specifically, with reference to FIG. 6, the capacitor 90 is connected in parallel with the temperature switch 20. The input power supply, identified with the reference numeral 92 is connected between an output terminal 94 and the parallel combination of the capacitor 90 and the temperature switch 20. The other side of the parallel combination of the temperature switch 20 and the capacitor 90 is connected to another output terminal identified with the reference numeral 96. As shown, an inductive load identified with the reference numeral 98 is connected between the output terminals 94 and 96. Since the voltage across a capacitor cannot change instantaneously, the capacitor 90 protects the temperature switch 20 from contact arcing due to switching of inductive loads.

Figure 8:
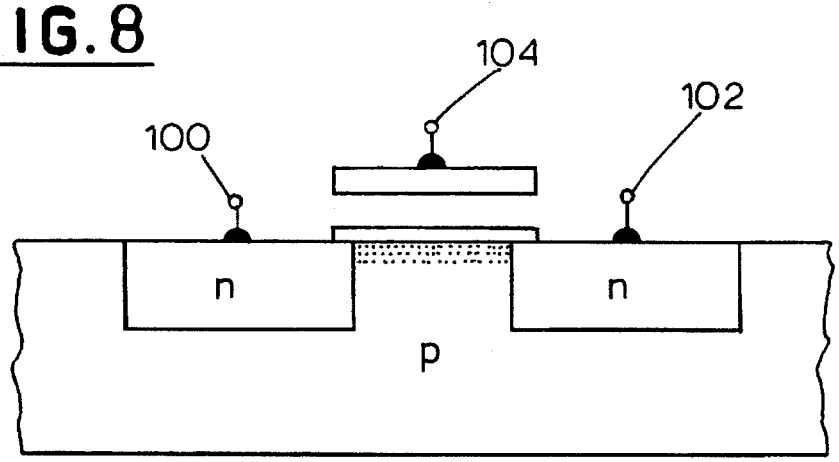
FIG. 8 is similar to FIG. 7 and illustrates another alternate embodiment of the invention formed from an enhancement mode metal oxide semiconductor field effect transistor (MOSFET)
Figure 9:
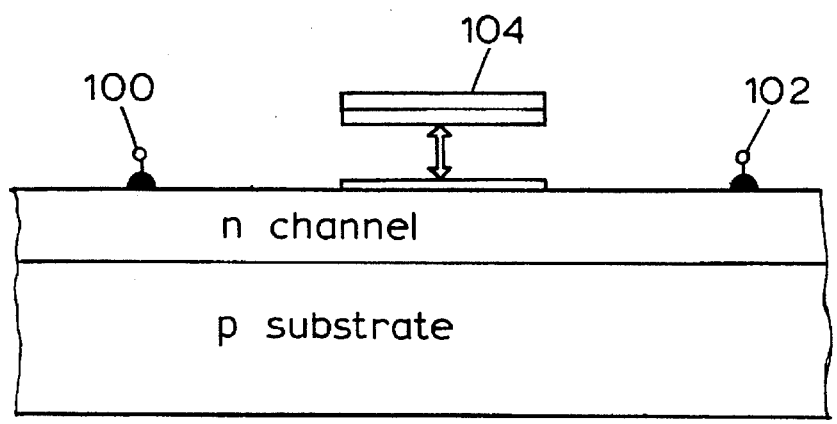
FIG. 9 is similar to FIG. 7, illustrating another alternate embodiment of the present invention formed from an N channel depletion mode MOSFET.
Figure 10:
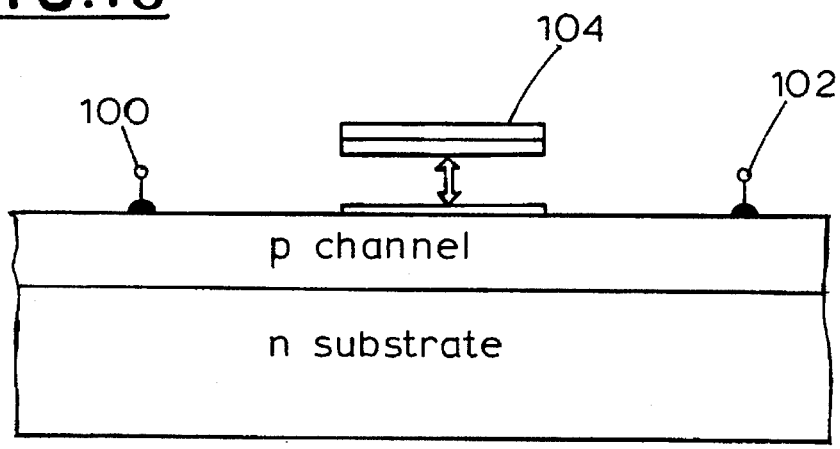
FIG. 10 is similar to FIG. 9, illustrating another alternate embodiment of the present invention formed from a P-channel depletion mode MOSFET.

An alternative embodiment of the invention is illustrated in FIGS. 7–10. In this embodiment, the electrical contacts 24 are substituted with an FET. As will be appreciated by those of ordinary skill in the art, such an embodiment can be formed with various types of FET's. For example, FIG. 7 illustrates an embodiment with an N-channel junction type field effect transistor. FIG. 8 illustrates an embodiment utilizing an enhancement mode metal oxide semiconductor field effect transistor. FIGS. 9–10 illustrate a depletion mode MOSFET wherein FIG. 9 relates to an N-channel and FIG. 10 relates to a P-channel.

In each of the embodiments, the field effect transistor is generally identified with the reference numeral 98 and includes fixed drain and source terminals 100 and 102, respectively, and a movable mounted gate terminal 104. In each of these embodiments, a source voltage +V is applied to the gate terminal 104. As the gap between the gate terminal 104 and the field effect transistor 98 becomes smaller, a sufficient electrical field is created to turn on the field effect transistor 98. Since little or no current will be flowing from the gate terminal to the field effect transistor, the problem of contact wear due to contact arcing is eliminated. Thus, in such an embodiment, it is not necessary to provide an electrostatic biasing force unless a snap action with hysteresis is desired, because any bouncing of the gate terminal 104 relative to the field effect transistor 98 will not cause any damage. Accordingly, there is no need for eliminating contact bounce; however, electrostatic biasing may be desirable if specific hysteresis values are desired.

Figure 11:
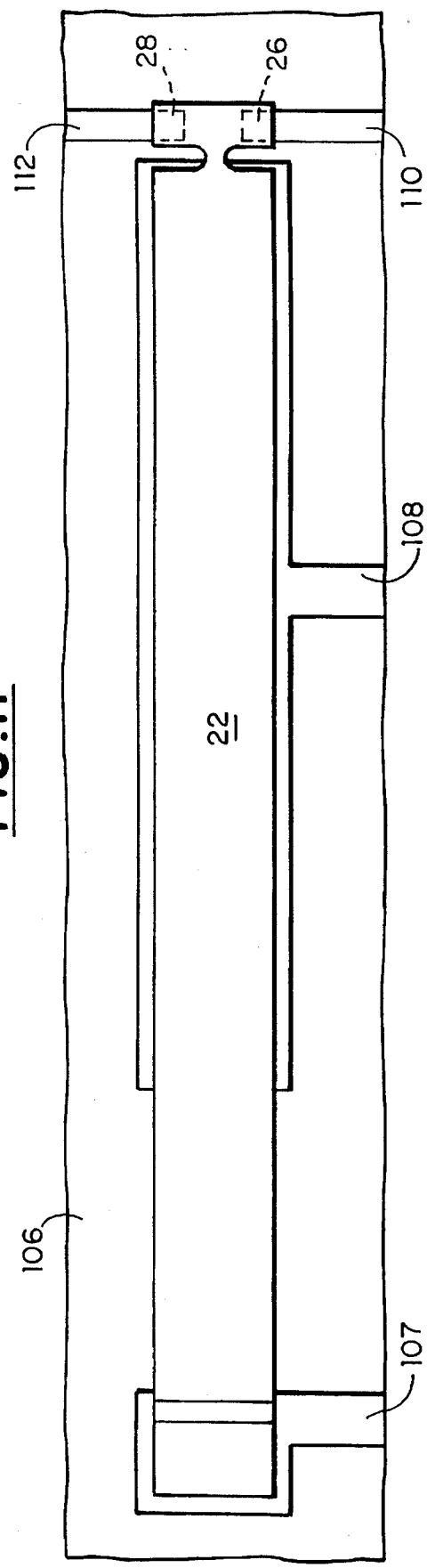
FIG. 11 is a plan view of the temperature switch illustrated in FIG. 1.
Figure 12:
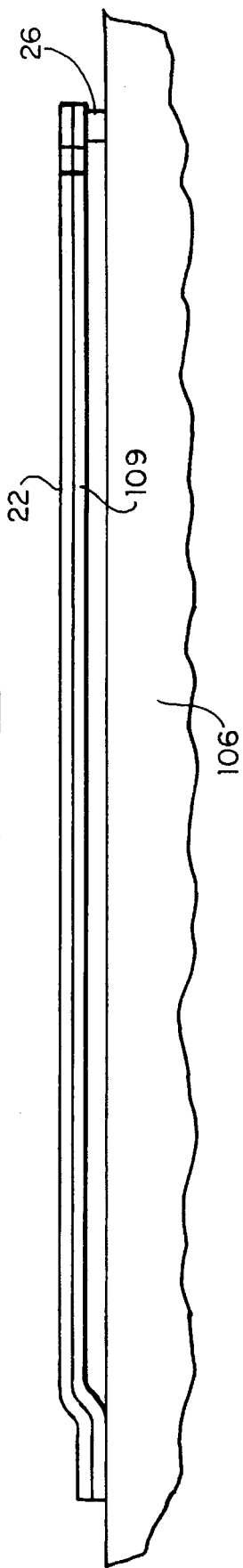
FIG. 12 is an elevational view of the temperature switch illustrated in FIG. 1.
Figure 13:
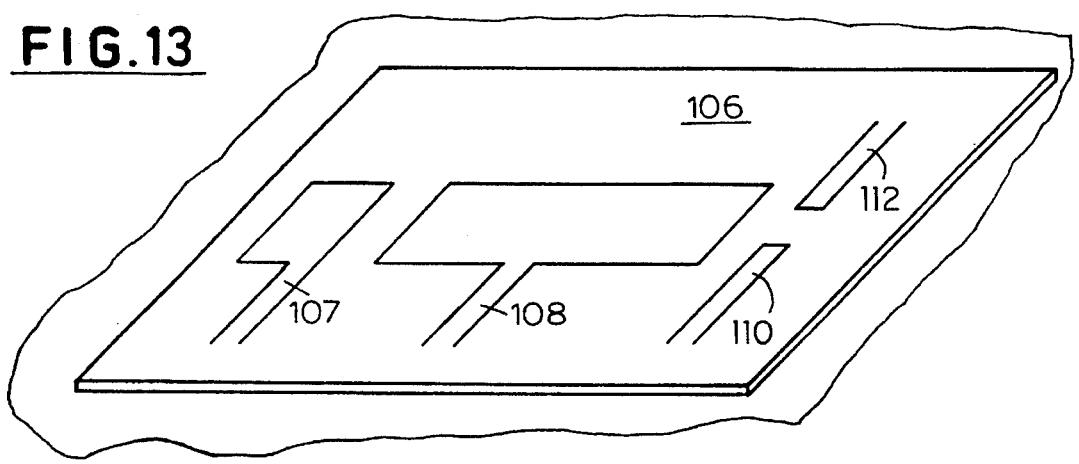
FIGS. 13–18 are simplified perspective views which illustrated the process for micromachining the temperature switch in accordance with the present invention.
Figure 14:
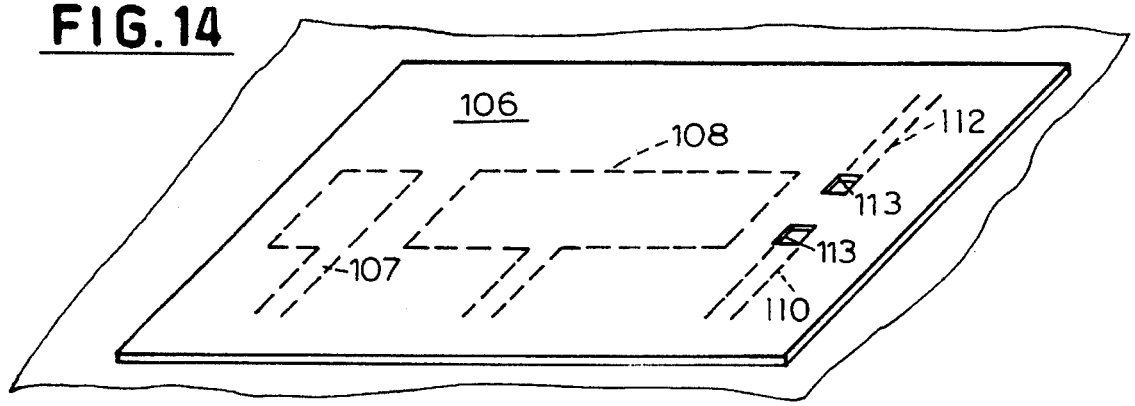
Figure 15:
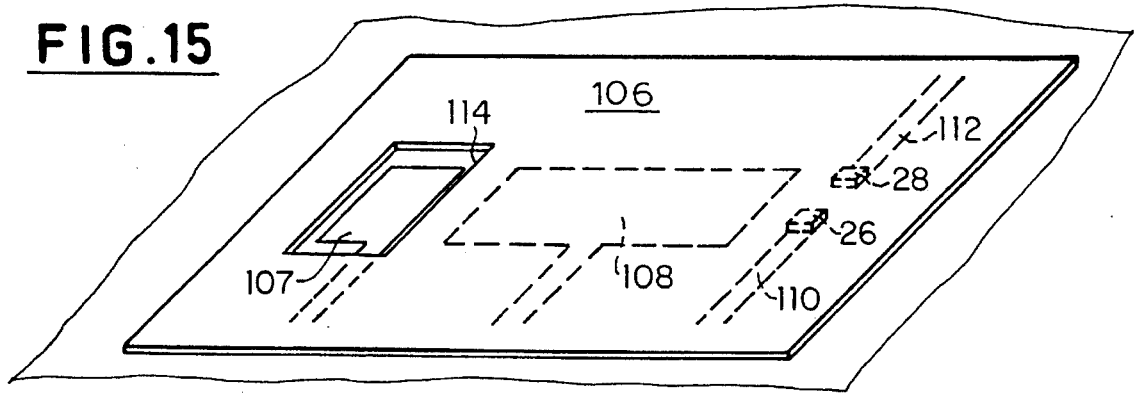
Figure 16:
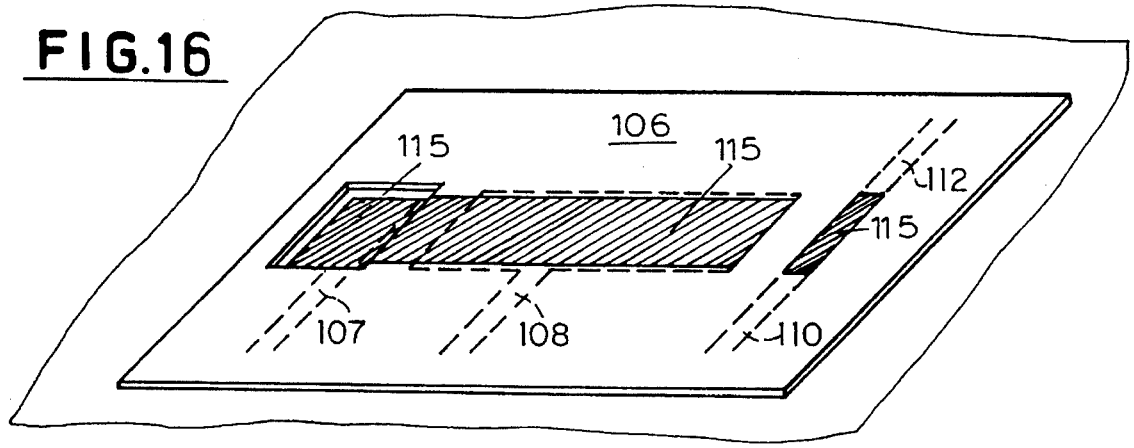
Figure 17:
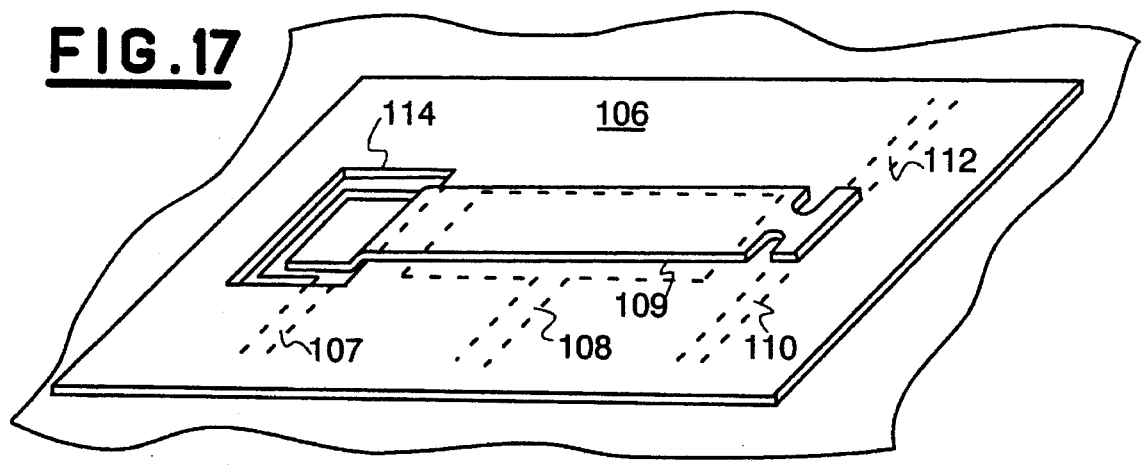
Figure 18:
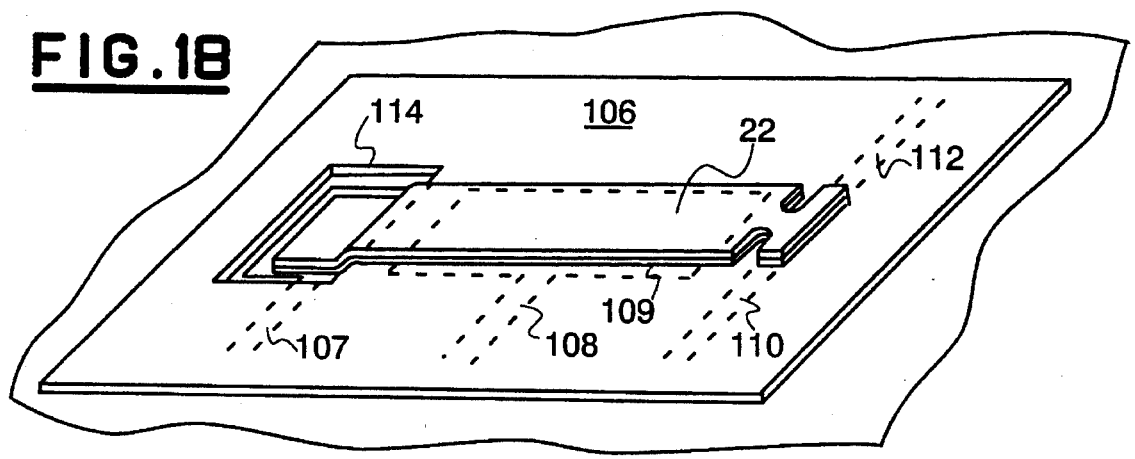

As discussed above, the temperature switch 20 in accordance with the present invention is adapted to be fabricated by micromachining techniques. Micromachining techniques refers to the creation of various mechanical devices on a silicon wafer. This allows such temperature switches to be manufactured without the necessity of assembling discrete components. It also allows a multitude of temperature switches 20 to be formed on a single wafer. For simplicity, only the embodiment described and illustrated in FIGS. 11 and 12 will be described below.

Referring to FIGS. 13 through 18, the temperature sensing element 22 is adapted to be formed 5 microns thick, 200 microns long and 20 microns wide and is cantilever mounted on a silicon substrate 106 with a predetermined gap therebetween. A gold layer may be deposited on the silicon substrate 106 for forming various electrodes. One pair of electrodes, identified with the reference numerals 107 and 108, is used for application of the electrostatic biasing voltage. Another pair of electrodes identified with the reference numerals 110 and 112, is used to provide output terminals for the temperature switch 20. More specifically, the electrodes 107, 108, 110 and 112 are formed by depositing a gold layer on the silicon wafer 106 with a shadow mask or by coating the entire wafer and etching away undesired areas. Next, a relatively thick photoresist is deposited over the gold electrodes 107, 108, 110 and 112. A shadow mask may then be used in order to strip away a portion of the photoresist in order to form the contact pads for the fixed stationary contacts 26 and 28. The stationary contacts 26 and 28 are adapted to mate with the movably mounted main contact disposed on the underside of the temperature sensing element 22. The contacts 26 and 28 also act as a stop limit as discussed above. More specifically, the shadow mask is formed to provide openings 113 (FIG. 14) for the contact pads for the stationary contacts 26 and 28. The wafer is then exposed to ultraviolet light and subsequently disposed in a developing solution to form the holes 113 for the contact pads for the stationary contacts 26 and 28. Gold contact pads, for example, 3 microns, are then plated on the stationary contacts 26 and 28. After the gold contact pads are plated on, a thin film, such as photoresist, is used to form a uniform height on the wafer to account for the raised contact pads. Accordingly, the film applied to the contact pads is thinner than surrounding areas. Next, a hole 114 (FIG. 15) is formed in the photoresist for attachment of the temperature sensing element 22 to the electrode 107 as shown. After the hole 114 is formed, gold (identified with the reference numeral 115) is then deposited on the surface either by sputtering or vacuum evaporation for later attachment to the temperature sensing element 22. Subsequently, an insulating layer is applied. After the insulating layer is applied, the bimetallic element 22 (FIGS. 11 and 12) is formed on the wafer 106.

Various materials may be used to form the bimetallic element. It is only necessary that the substances used to form the bimetallic element 22 have differing coefficients of thermal expansion. For example, polysilicon and aluminum may be used.

In such an application, the aluminum may be deposited and electroplated to the desired thickness. Next, chemical or reactive ion etching may be used to etch away excess aluminum to form the pattern for the first layer of the bimetallic element. Subsequently, a second material with a different coefficient of thermal expansion is applied. The excess is etched away as discussed above to form the bimetallic element. Lastly, the photoresist is stripped away, for example, by exposure to ultraviolet light and submersion in a developing solution to strip the photoresist from underneath and around the bimetallic element. This frees up the temperature sensing element 22 to allow it to deflect as a function of temperature as discussed above.

Alternate embodiments of the temperature switch 20, as illustrated in FIGS. 4–6, may be formed in a similar manner with the addition of a capacitor and/or transistors in a known manner. The embodiment illustrated and described in FIGS. 7–10 is formed in a similar manner except the electrodes need not be formed. However, in that embodiment, since electrostatic biasing force is not required, the electrodes for connection to the external source of electrical voltage and the electrodes for the electrical contacts can be eliminated. Rather, a field effect transistor would be formed in a known manner with the exception that the gate terminal would be movably mounted to the underside of the bimetallic element.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A temperature switch comprising:

a sensing element which includes a bimetallic strip, said sensing element adapted to be displaced as a function of temperature defining a first stable position and a second stable position;

means for biasing said sensing element and causing said sensing element to be unstable between said first stable position and said second stable position, wherein said biasing means includes means for applying an electrostatic force to said sensing element; and means, operatively coupled to said sensing element, for providing signals indicative of said first stable position and said second stable position.

2. A temperature switch as recited in claim 1 wherein said switch is configured to provide squeeze film damping of said sensing element.

3. A temperature switch as recited in claim 1, wherein said providing means includes a pair electrical contacts.

4. A temperature switch as recited in claim 1, further including means for coupling said biasing means.

5. A temperature switch as recited in claim 4, wherein said switch includes means for coupling said biasing means and sensing element and wherein said sensing element and said providing means are formed as a monolithic chip, said monolithic chip further includes integrally formed means operatively coupled to said providing means for switching relatively large electrical currents.

6. A temperature switch as recited in claim 5, wherein said switching means includes a power transistor.

7. A temperature switch as recited in claim 6, wherein said power transistor is a bipolar transistor.

8. A temperature switch as recited in claim 6, wherein said power transistor is a field effect transistor.

9. A temperature switch as recited in claim 4, wherein said monolithic chip includes integrally formed means for protecting said providing means during switching of inductive loads.

10. A temperature switch as recited in claim 9, wherein said protecting means includes a capacitor.

11. A monolithic temperature switch comprising:

means for sensing temperature adapted to be displaced as a function of temperature between a first position and a second position;

means operatively coupled to said sensing means for providing an electrical signal as a function of temperature; and means for biasing said sensing means, wherein said biasing means includes means for applying a non-linear force to said sensing means and wherein said non-linear force is proportional to the square of the distance of said sensing means from said first position; and said sensing means and said providing means are integrally formed on a monolithic chip.

12. A monolithic temperature switch as recited in claim 11, wherein said non-linear force is an electrostatic force.

13. A monolithic temperature switch as recited in claim 11, wherein said applying means is adjustable.

14. A monolithic temperature switch as recited in claim 11, further including means for switching relatively large electrical currents electrically coupled to said providing means and integrally formed as part of said monolithic temperature switch.

15. A monolithic temperature switch as recited in claim 14, wherein said switching means includes a power transistor.

16. A monolithic temperature switch as recited in claim 11, further including means for protecting said providing means from damage due to inductive electrical loads connected to said providing means integrally formed as a part of said monolithic temperature switch.

17. A monolithic temperature switch as recited in claim 16, wherein said protecting means includes a capacitor electrically coupled to said providing means.

18. A monolithic temperature switch as recited in claim 11, further including means for forcing said sensing means to be unstable between said first position and said second position.

19. A monolithic temperature switch as recited in claim 11, further including means for substantially eliminating contact arcing during transactions between said first position and said second position.

20. A monolithic temperature switch as recited in claim 17, further including means for applying a force to said providing means in said first position or said second position.

21. A monolithic temperature switch as recited in claim 17, further including means for preventing transition of said providing means resulting from external forces of a predetermined magnitude.

22. A monolithic temperature switch as recited in claim 11, further including means for adding hysteresis to said displacement of said sensing means.

23. A monolithic temperature switch as recited in claim 11, wherein said providing means includes a field effect transistor (FET) with a movably mounted gate terminal forming said sensing means.

24. A monolithic temperature switch as recited in claim 23, wherein said providing means is adapted to provide an electrical signal as a function of the distance between the sensing means and said FET.

25. A monolithic temperature switch as recited in claim 24, wherein said sensing means includes a bimetallic element.

26. A monolithic temperature switch as recited in claim 11, wherein said switch is configured to provide squeeze film damping of said sensing element.

27. A monolithic temperature switch comprising:

means for sensing temperature adapted to be displaced as a function of temperature between a first position and a second position;

means operatively coupled to said sensing means for providing an electrical signal as a function of temperature;

means for adding hysteresis to a displacement of said sensing means; and means for controlling the hysteresis; wherein said sensing means and said providing means are integrally formed on a monolithic chip.

28. A monolithic temperature switch as recited in claim 27, wherein said controlling means includes a stop for adjusting one or the other of said first position or said second position.

29. A monolithic temperature switch as recited in claim 27, wherein said sensing means includes a bimetallic element.

30. A monolithic temperature switch comprising:

means for sensing temperature which includes a bimetallic strip adapted to be displaced as a function of temperature between a first position and a second position;

means operatively coupled to said sensing means for providing an electrical signal as a function of temperature; and means for applying an electrostatic force to said bimetallic strip; wherein said sensing means and said providing means are integrally formed on a monolithic chip.

* * * * *